United States Patent
Cao et al.

(10) Patent No.: US 9,202,943 B2
(45) Date of Patent: Dec. 1, 2015

(54) NIOBIUM THIN FILM STRESS RELIEVING LAYER FOR THIN-FILM SOLAR CELLS

(71) Applicant: International Business Machines Corporation, Armonk, NY (US)

(72) Inventors: Qing Cao, Yorktown Heights, NY (US); Zhengwen Li, Danbury, CT (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/453,655

(22) Filed: Aug. 7, 2014

(65) Prior Publication Data

US 2014/0345687 A1 Nov. 27, 2014

Related U.S. Application Data

(62) Division of application No. 13/534,519, filed on Jun. 27, 2012, now Pat. No. 8,822,816.

(51) Int. Cl.
*H01L 31/0296* (2006.01)
*H01L 31/0224* (2006.01)
*H01L 31/0216* (2014.01)
*H01L 31/0749* (2012.01)
*H01L 31/032* (2006.01)

(52) U.S. Cl.
CPC ...... *H01L 31/02167* (2013.01); *H01L 31/0296* (2013.01); *H01L 31/022425* (2013.01); *H01L 31/022441* (2013.01); *H01L 31/022475* (2013.01); *H01L 31/0322* (2013.01); *H01L 31/0326* (2013.01); *H01L 31/0749* (2013.01); *Y02E 10/541* (2013.01)

(58) Field of Classification Search
None
See application file for complete search history.

(56) References Cited

U.S. PATENT DOCUMENTS

| | | | | |
|---|---|---|---|---|
| 5,584,941 A | * | 12/1996 | Nishida | 136/258 |
| 6,236,061 B1 | * | 5/2001 | Walpita | 257/40 |
| 7,544,884 B2 | | 6/2009 | Hollars | |
| 2004/0063320 A1 | * | 4/2004 | Hollars | 438/689 |
| 2007/0093006 A1 | * | 4/2007 | Basol | 438/150 |
| 2008/0230779 A1 | * | 9/2008 | Goyal | 257/49 |

(Continued)

FOREIGN PATENT DOCUMENTS

JP 2000026926 A * 1/2000 ............ C22C 1/04

OTHER PUBLICATIONS

D. Abou-Ras in "Annual Report 2005." Institute of Applied Physics, Eth Zurich, Switzerland, pp. 10-11.

(Continued)

*Primary Examiner* — Michael Lebentritt
*Assistant Examiner* — Jordan Klein
(74) *Attorney, Agent, or Firm* — Cantor Colburn LLP; Steven Meyers

(57) ABSTRACT

A photovoltaic device includes a thermal stress relieving layer on top of a substrate; a back ohmic contact on the thermal stress relieving layer; and a p-type semiconductor photon absorber layer on the back ohmic contact. The back ohmic contact comprises a metallic compound of the sacrificial back electrode metal layer and the absorber layer, in combination with the thermal stress relieving layer. The thermal stress relieving layer has a substantially similar thermal expansion coefficient with respect to the substrate and the absorber layer and a lower Young's modulus with respect to the sacrificial back electrode metal layer.

6 Claims, 5 Drawing Sheets

(56) References Cited

U.S. PATENT DOCUMENTS

| | | | |
|---|---|---|---|
| 2008/0251120 A1 | 10/2008 | Malmstrom et al. | |
| 2010/0229936 A1* | 9/2010 | Yago et al. | 136/256 |
| 2010/0229940 A1 | 9/2010 | Basol | |
| 2010/0252110 A1* | 10/2010 | Yago et al. | 136/261 |
| 2010/0269907 A1 | 10/2010 | Lackner et al. | |
| 2011/0174363 A1 | 7/2011 | Munteanu | |
| 2011/0189814 A1* | 8/2011 | Kawano et al. | 438/94 |
| 2011/0201143 A1* | 8/2011 | Westin et al. | 438/66 |
| 2011/0277840 A1 | 11/2011 | Bryden et al. | |
| 2013/0081688 A1 | 4/2013 | Liang et al. | |
| 2013/0284251 A1* | 10/2013 | Krasnov et al. | 136/256 |
| 2013/0284253 A1* | 10/2013 | Krasnov | 136/256 |

OTHER PUBLICATIONS

K. Orgassa et al., "Alternative back contact materials for thin film Cu(In,Ga)Se2 solar cells," Thin Solid Films, vols. 431-432, May 1, 2003, pp. 387-391.

P. A. A. Booi et al., "Intrinsic stress in DC sputtered niobium," IEEE Transactions on Applied Superconductivity, vol. 3, Issue 2, Jun. 1993, pp. 3029-3031.

Q. Cao et al., "Defects in Cu(In,Ga)Se2 Chalcopyrite Semiconductors: A Comparative Study of Material Properties, Defect States and Photovoltaic," Advanced Energy Materials, vol. 1, Issue 5, pp. 845-853, Oct. 2011.

* cited by examiner

NIOBIUM THIN FILM STRESS RELIEVING LAYER FOR THIN-FILM SOLAR CELLS

DOMESTIC PRIORITY

This application is a divisional of U.S. application Ser. No. 13/534,519 (Cao et al.), filed on Jun. 27, 2012, which is herein incorporated by reference in its entirety.

BACKGROUND

The present invention relates generally to semiconductor device manufacturing and, more particularly, to a niobium thin-film stress relieving layer for thin-film solar cells.

Solar cells are photovoltaic devices that convert sunlight directly into electrical power. Generally, p-n junction based photovoltaic cells include a layer of an n-type semiconductor in direct contact with a layer of a p-type semiconductor. When a p-type semiconductor is positioned in intimate contact with an n-type semiconductor, a diffusion of electrons occurs from the region of high electron concentration (the n-type side of the junction) into the region of low electron concentration (the p-type side of the junction). However, the diffusion of charge carriers (electrons) does not happen indefinitely, as an opposing electric field is created by this charge imbalance. The electric field established across the p-n junction induces a separation of charge carriers that are created as result of photon absorption.

The most common type of solar cell material is silicon, which is in the form of single or polycrystalline wafers. However, the cost of electricity generated using silicon-based solar cells is still higher than the cost of electricity generated by the more traditional methods. Since the early 1970's there has been an effort to reduce cost of solar cells for terrestrial use. One way of reducing the cost of solar cells is to develop low-cost, thin-film growth techniques that can deposit solar cell quality absorber materials on large area substrates and to fabricate these devices using high-throughput, low-cost methods.

The increased interest in thin-film photovoltaics has been due primarily to improvements in conversion efficiency of cells made at the laboratory scale, with the anticipation that manufacturing costs can be significantly reduced compared to the older and more expensive crystalline and polycrystalline silicon technology. The term "thin-film" is thus used to distinguish this type of solar cell from the more common silicon based cell, which uses a relatively thick silicon wafer. While single crystal silicon cells still demonstrate the best conversion efficiency to date at over 20%, thin-film cells have been produced which can perform close to this level. As such, performance of the thin-film cells is no longer the major issue that limits their commercial use. Instead, primary factors now driving the commercialization of thin-film solar cells include cost, manufacturability, reliability and throughput, for example.

SUMMARY

In one aspect a photovoltaic device includes a thermal stress relieving layer on top of a substrate; a back ohmic contact on the thermal stress relieving layer; and a p-type semiconductor photon absorber layer on the back ohmic contact; wherein the back ohmic contact comprises a metallic compound of the sacrificial back electrode metal layer and the absorber layer, in combination with the thermal stress relieving layer, and wherein the thermal stress relieving layer has a substantially similar thermal expansion coefficient with respect to the substrate and the absorber layer and a lower Young's modulus with respect to the sacrificial back electrode metal layer.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
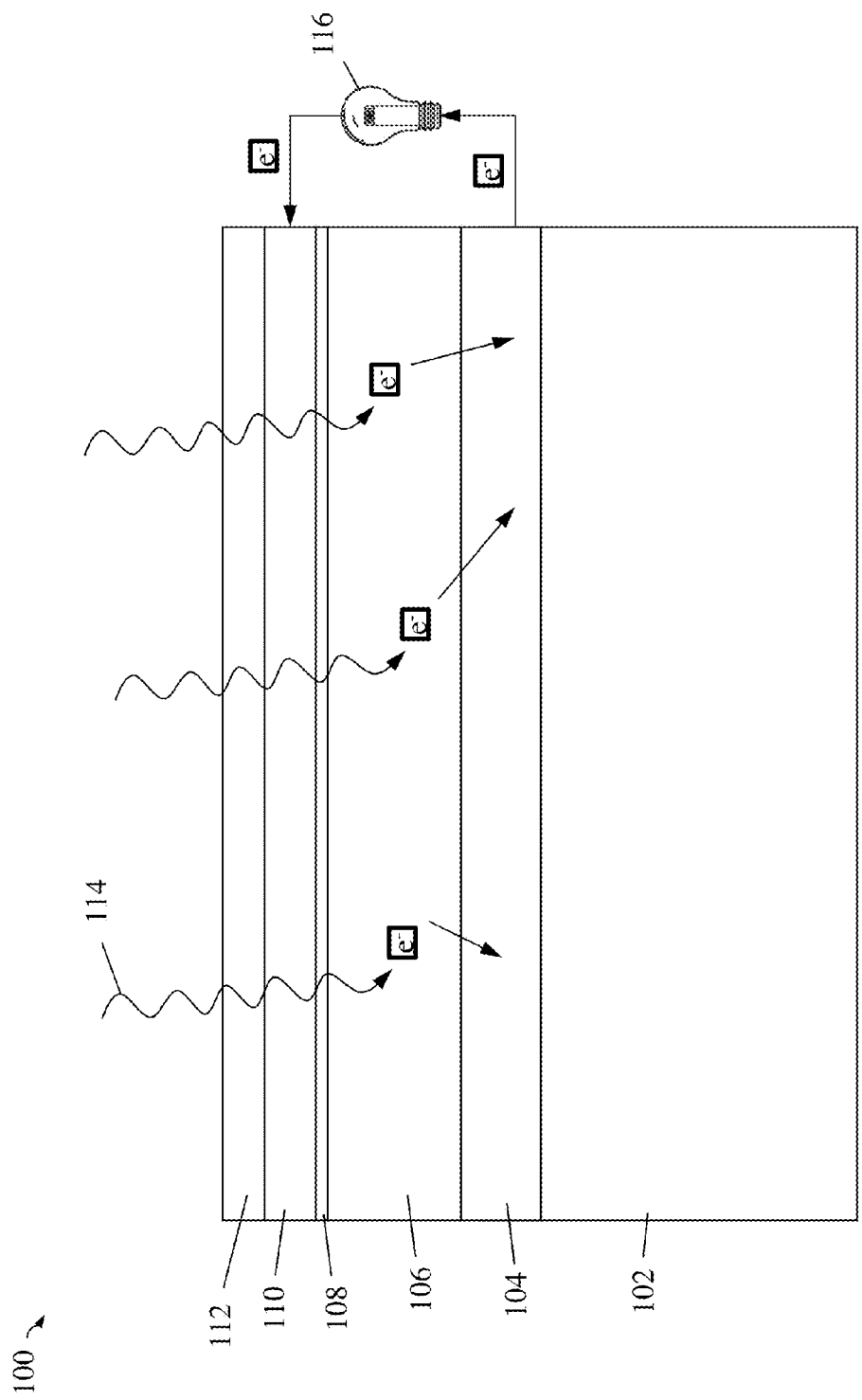
FIG. 1 is a cross sectional schematic view of a thin-film photovoltaic cell.

With respect to thin-film photovoltaic cells as discussed above, FIG. 1 is a cross sectional schematic view of one exemplary type of cell 100. The thin-film cell 100 is fabricated on a substrate 102, such as a sheet of glass, a sheet of metal, an insulating foil or web, or a conductive foil or web, for example. A back electrical contact layer 104 is deposited on the substrate 102, and serves as an ohmic contact for the cell 102. One example of such a back contact material layer is molybdenum (Mo), which is currently perhaps the most commonly used material, having a thickness of about 0.5 microns (μm) to about 2.0 μm. A photon absorber layer 106 is formed on the back contact layer 104. In such a thin-film structure, the absorber layer 106 may be a copper-indium-gallium-sulfide/selenide (CIGS) or copper-zinc-tin-sulfide/selenide (CZTS), p-type semiconductor absorber layer, having an exemplary thickness of about 0.5 μm to 3 μm thick.

As further illustrated in FIG. 1, an n-type semiconductor layer 108 is formed over the absorber layer 106 so as to define a p-n junction therebetween. Relatively speaking, the n-type layer 108 is much thinner than the absorber layer (e.g., about 60 nanometers (nm)), and is desirably highly transparent to solar radiation. An exemplary material for the n-type layer 108 is cadmium sulfide (CdS). Formed upon the n-type layer 108 is a thin, (e.g., about 0.2 μm to about 0.6 μm) transparent top electrode 110, which completes a functioning cell. The top electrode 110 is both highly conductive and as transparent as possible to solar radiation. Exemplary top electrode materials in this regard include transparent conductive oxides (TCO) such as, for example, zinc oxide (ZnO), indium tin oxide (ITO), aluminum doped ZnO, etc. An optional antireflection (AR) coating 112 is also depicted on the solar cell structure 100 of FIG. 1, which can allow a significant amount of extra light into the cell 100. Depending on the intended use of the cell 110, the AR coating 112 may be deposited directly on the top electrode 110 (as illustrated), or on a separate cover glass, or both.

In operation, some photons 114 in sunlight pass through the AR coating 112, top electrode 110 and n-type layer 108, and are absorbed by the p-type semiconductor absorber layer 106. Other photons, depending on the photon energy, may reflect off the cell surface or pass completely through absorber layer 106. In the latter case, it is possible that photos may be reflected back from the back electrical contact layer 104 and then absorbed by the absorber layer 106. In any case, photons that are absorbed by the absorber layer 106 give their energy to the crystal lattice of the absorber layer 106, in turn knocking electrons loose from their atoms. Due to the composition of the cell 100, the electrons flow in a single direction, and therefore are capable of providing direct current (DC) electricity to an exemplary load 116.

Figure 2:
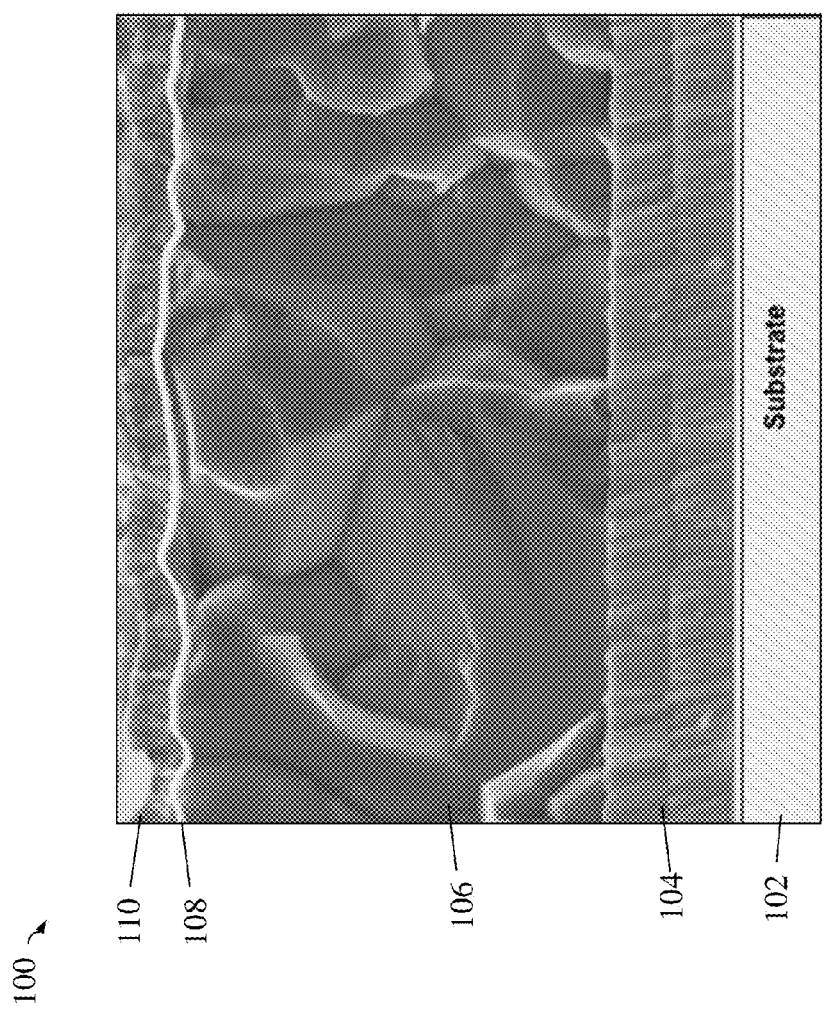
FIG. 2 is a cross sectional view of various photovoltaic cell layers, such as the cell schematically depicted in FIG. 1.

In more structural detail, FIG. 2 is a cross sectional view of various photovoltaic cell layers, such as the cell 100 schematically depicted in FIG. 1. For ease of illustration, similar layers in FIGS. 1 and 2 are designated with the same reference numeral. The exemplary substrate 102 shown in FIG. 2 may be formed from a material such as glass, metal foil or plastic. In the case of glass, the substrate 102 has a thermal expansion coefficient (TEC) of about $9 \times 10^{-6}$/K and a Young's modulus of about 80 gigapascals (GPa). The molybdenum back electrical contact layer 104 has a TEC of about $4.8 \times 10^{-6}$/K, a Young's modulus of about 329 GPa, and an electrical resistivity of about $5 \times 10^{-8}$/Ω·m (ohm-meters). In addition, the relatively thick CIGS/CZTS absorber layer 106 has a TEC of about $9 \times 10^{-6}$/K, a Young's modulus of about 60 GPa.

Physical vapor deposition (PVD) based processes, and particularly sputter based deposition processes, have conventionally been utilized for high volume manufacturing of such thin film layers with high throughput and yield. More recently, techniques for depositing the CIGS/CZTS absorber layer 106 via solution (instead of by traditional vacuum based co-sputtering and co-evaporation deposition processes) have attracted increasing attention. Advantages associated with such solution-based deposition techniques include lower-initial capital cost, higher throughput, and higher material utilization rate.

Figure 3:
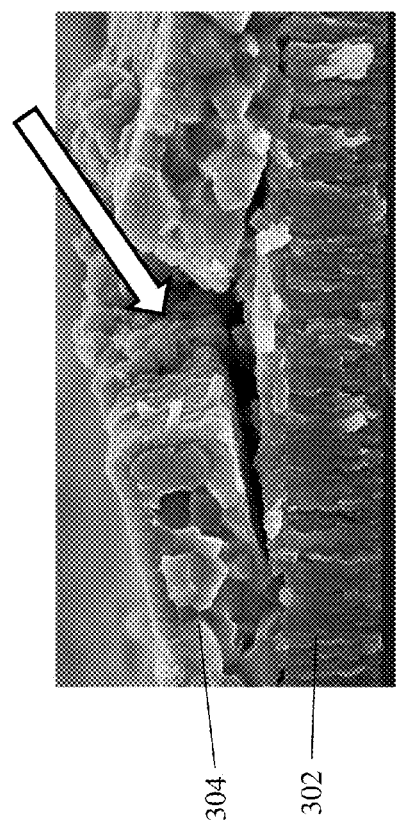
FIG. 3 is a scanning electron micrograph (SEM) image of a molybdenum back electrical contact layer and a CIGS absorber layer formed thereon.

For the traditional vacuum based deposition processes, the deposition takes place at an elevated temperature, e.g., about 400° C. to about 600° C., to form polycrystalline semiconductors with large grain size. The cooling process after deposition could lead to high thermal stress at CIGS/CZTS-Mo interface, which in turn can lead to severe film cracking issues. For low-temperature, solution-based processes, a rapid high temperature annealing step after deposition is necessary to transform initially deposited amorphous or nanocrystalline films into high quality, polycrystalline films for solar cell applications. However, such a rapid heating/cooling process may also lead to very high thermal stress at CIGS/CZTS-Mo interface, which in turn can lead to severe film cracking issues. For example, FIG. 3 is a scanning electron micrograph (SEM) image of a molybdenum back electrical contact layer 302 and a CIGS absorber layer 304 formed thereon. However, due to the thermal stress from annealing, the CIGS absorber layer 304 suffers from cracking and delamination, as indicated at the arrow.

Figure 4:
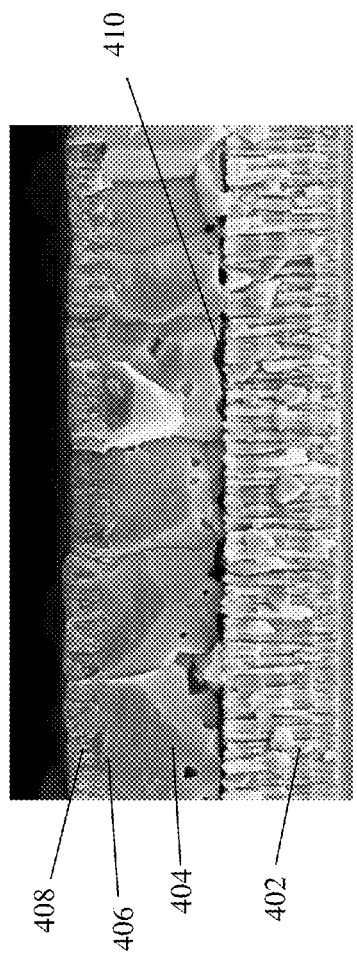
FIG. 4 is another scanning electron micrograph (SEM) image of a molybdenum back electrical contact layer and a CIGS absorber layer formed thereon.

Other issues associated with rapid high temperature annealing of solution deposited semiconductor films are illustrated in FIG. 4. As shown in the SEM image of FIG. 4, a molybdenum back electrical contact layer 402 has a CIGS absorber layer 404 formed thereon. FIG. 4 also depicts a CdS n-type layer 406 on the CIGS layer 404, and a ZnO/TCO top electrode 408 on the CdS n-type layer 406. Although the CIGS layer 404 is not cracked in this particular image, multiple voids/defects 410 between the CIGS layer 404 and the molybdenum back electrical contact layer 402 are evident. These voids and defects could adversely affect both the power conversion efficiency of associated solar cells and the yield of integrated solar modules.

In terms of surface delamination energy, which is a function of material hardness, thickness, and thermal expansion coefficient, a molybdenum back electrical contact layer is not well matched with, for example, a glass substrate and a semiconductor CIGS/CZTS absorber layer. Relatively speaking, molybdenum has a lower CTE with respect to glass and CIGS/CZTS and a high modulus. On the other hand, molybdenum works well as a back contact metal since the reaction between molybdenum and (for example) selenium in CIGS produces a layer of $MoSe_2$, which forms an ohmic contact.

Accordingly, the exemplary embodiments disclosed herein address the above described problems by introducing a thermal stress relieving layer between the solar cell substrate and a molybdenum-based compound. Initially, several materials for the stress relieving layer were considered based on the following desired characteristics: (1) a TEC of about $9 \times 10^{-6}$/K to match up with glass and CIGS/CZTS; (2) a relatively low modulus; (3) low resistivity; (4) high melting temperature; (5) low reactivity with selenium/sulfur; and (6) low cost, high abundance.

Based on these criteria, titanium (Ti), while having desirable TEC, modulus and resistivity values, is hard to form a low-stress, thick film, has high reactivity with Se, and is expensive. Titanium nitride (TiN) also has a matching TEC but has a high modulus and is a difficult material for forming a thick film. Platinum (Pt), while having a suitable TEC, is an expensive material for photovoltaic applications. Vanadium (V) has compatible TEC, modulus and resistivity values, but like titanium, has high reactivity with Se.

In contrast, niobium (Nb), has a compatible TEC (about $7.4 \times 10^{-6}$/K), low modulus (about 105 GPa), and resistivity (about $15 \times 10^{-8}$/Ω·m). In addition, niobium has a melting temperature of 2468K, has low reactivity with selenium, is easy to form a low-stress thick film, and has a cost comparable with that of molybdenum.

Figure 5:
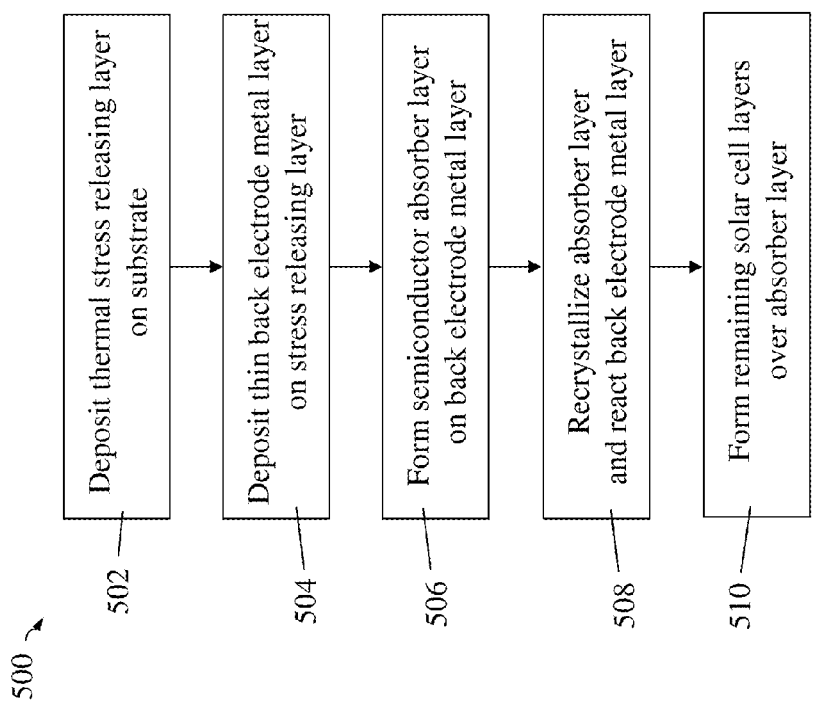
FIG. 5 is a flow diagram illustrating a method of forming a solar cell having a thin-film stress relieving layer, in accordance with an exemplary embodiment.
Figure 6:
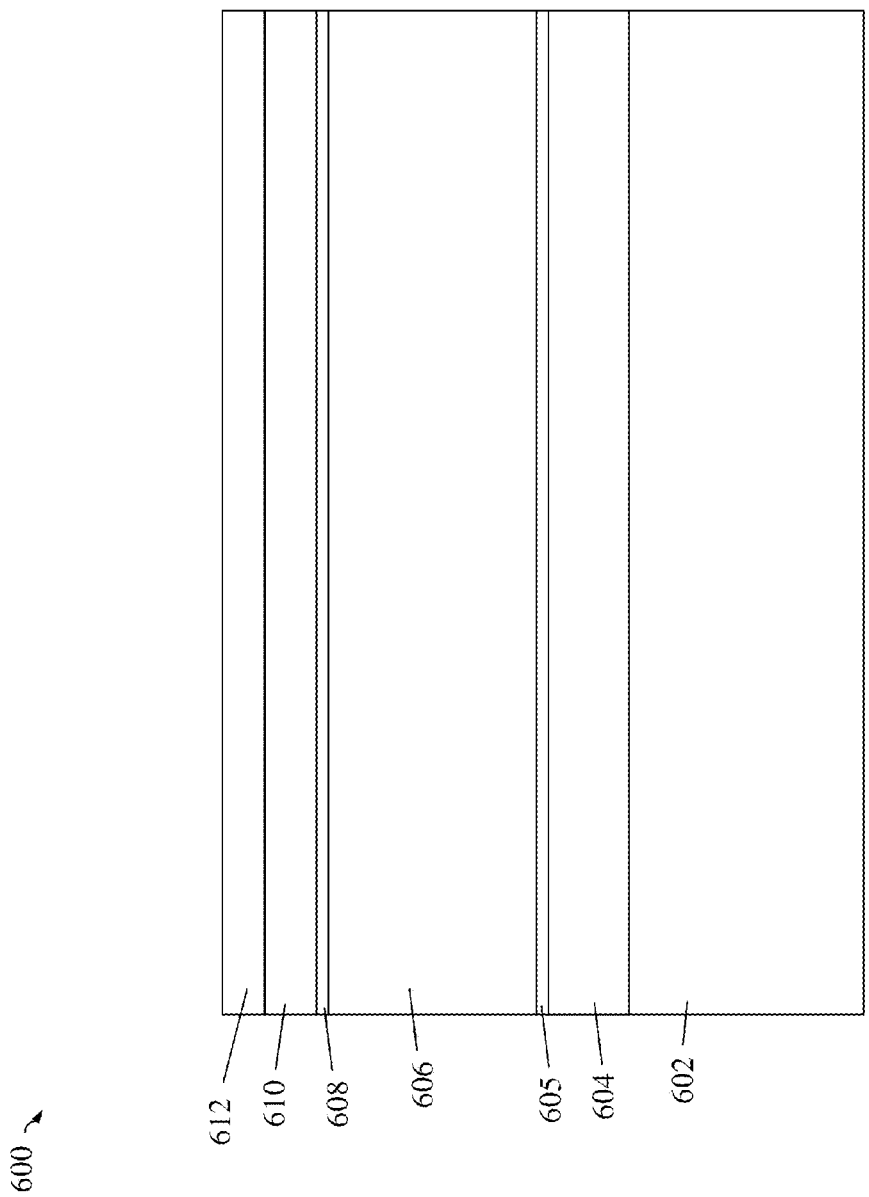
FIG. 6 is a cross sectional schematic view of a thin-film photovoltaic cell, such as formed in accordance with the processing illustrated in FIG. 5.

Referring now to both FIGS. 5 and 6, FIG. 5 is a flow diagram illustrating a method 500 of forming a solar cell having a thin-film stress relieving layer, in accordance with an exemplary embodiment. FIG. 6 is a cross sectional schematic view of a thin-film photovoltaic cell 600, such as formed in accordance with the processing illustrated in FIG. 5.

As illustrated in block 502 of FIG. 5, a conductive thermal stress relieving layer is deposited on a substrate. In the exemplary embodiment of FIG. 6, the substrate 602 a material such as glass, metal foil or plastic. In the case of glass, the substrate 602 has a TEC of about $9 \times 10^{-6}$/K and a Young's modulus of about 80 GPa. In contrast to a thick molybdenum layer formed directly on the substrate, the cell 600 has a niobium thermal stress relieving layer 604 formed on the substrate 602, which is thick enough to provide low resistance for electron transport. In an exemplary embodiment, the Nb thermal stress relieving layer 604 may have a thickness of about 0.5 μm to about 2.0 μm. After deposition of the Nb thermal stress relieving layer, a thin back electrode metal layer is formed directly on the thermal stress relieving layer as indicated in block 504 of FIG. 5. As indicated above, molybdenum is still a desirable metal for this purpose. However, in contrast to conventional solar cell designs, the sacrificial back electrode metal layer is composed of a thin layer of molybdenum (e.g., on the order of about 60 nm) for better contact and a conductive stress relieving layer. This decreased thickness of a hard molybdenum layer and the adoption of a thick but soft stress relieving layer with better matched TEC minimize thermal stresses at the interfaces between the back electrode metal layer and a subsequently formed absorber layer, without affecting the resistance of the back electrode.

In block 506 of FIG. 5, a semiconductor absorber layer is formed on the back electrode metal layer. The absorber layer may be, for example, CIGS, CZTS, or combinations thereof. Embodiments described herein are applicable to either vacuum-based semiconductor deposition techniques at elevated temperatures or, alternatively to a low temperature (e.g., room temperature) solution-based spin-on technique, followed by a recrystallizing anneal process.

In either approach, as depicted in block 508, the device is at some point subjected to an elevated temperature process (either during or after semiconductor absorber layer deposition) to transform the semiconductor film into a high quality, polycrystalline for solar cell applications. For a low temperature, liquid depositon of semiconductor material, this may be followed by a rapid thermal anneal (RTA) or a laser spike anneal. As a result of the elevated temperature process, the molybdenum back electrode metal layer reacts with the absorber to form a compound of, for example, molybdenum selenide ($MoSe_2$) or molybdenum disulfide ($MoS_2$). The molybdenum back electrode may or may not completely react with the absorber, but in any case forms part of an ohmic contact. With respect to FIG. 6, the thin, reacted molybdenum-based compound is indicated by a back interface contact layer 605 atop the niobium thermal stress relieving layer 604, which together define a back electrode.

As further illustrated in FIG. 6, the CIGS/CZTS absorber layer 606 is formed atop the thin, back interface contact layer 605. Once the CIGS/CZTS absorber layer 606 is formed, the remaining solar cell layers may be formed as indicated in block 510 of FIG. 5. These layers include, as shown in FIG. 6 for example, a thin n-type layer 608 (e.g., about 60 nanometers (nm)) transparent to solar radiation such as CdS), a thin (e.g., about 0.2 µm to about 0.6 µm) top transparent electrode 610, such as ZnO, ITO, aluminum doped ZnO, etc., and an optional AR coating 612.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A photovoltaic device, comprising:
a thermal stress relieving layer comprising niobium located directly on top of a substrate, the substrate comprising glass, wherein the thermal stress relieving layer has a thickness of about 0.5 microns (µm) to about 2.0 µm;
a back ohmic contact comprising molybdenum located directly on top of the thermal stress relieving layer; and
a p-type semiconductor photon absorber layer located directly on top of the back ohmic contact;
wherein the back ohmic contact comprises a metallic compound of a sacrificial back electrode metal layer and the absorber layer, and wherein the thermal stress relieving layer has a substantially similar thermal expansion coefficient with respect to the substrate and the absorber layer and a lower Young's modulus with respect to the sacrificial back electrode metal layer, and wherein the sacrificial back electrode metal layer has a thickness of about 60 nanometers (nm).

2. The device of claim 1, wherein:
the back ohmic contact comprises a molybdenum compound of molybdenum reacted with one or more of selenium and sulfur; and
the absorber layer comprises one or more of: copper-indium-gallium-sulfide/selenide (CIGS) and copper-zinc-tin-sulfide/selenide (CZTS).

3. The device of claim 1, wherein:
the absorber layer has a thickness of about 0.5 µm to about 3 µm.

4. The device of claim 3, further comprising:
a transparent, n-type semiconductor layer over the p-type absorber layer so as to define a p-n junction therebetween; and
a transparent top electrode on the n-type semiconductor layer.

5. The device of claim 4, wherein:
the substrate comprises glass;
the n-type semiconductor layer comprises cadmium sulfide (CdS) having a thickness of about 60 nm; and
the transparent top electrode comprises a transparent conductive oxide (TCO) having a thickness of about 0.2 µm to about 0.6 µm.

6. The device of claim 1, wherein the device is made by:
forming the sacrificial back electrode metal layer directly on top of the thermal stress relieving layer;
forming the absorber layer directly on top of the sacrificial back electrode metal layer, wherein the absorber layer is formed by depositing a solution at room temperature on the sacrificial back electrode metal layer;
annealing the device to react substantially an entire thickness of the sacrificial back electrode metal layer with the absorber layer to form the back ohmic contact.

* * * * *